(12) United States Patent
Kling et al.

(10) Patent No.: US 6,888,218 B2
(45) Date of Patent: May 3, 2005

(54) EMBEDDED CAPACITOR MULTI-CHIP MODULES

(75) Inventors: Dennis R. Kling, Milford, MA (US); Christopher D. Cotton, Chelmsford, MA (US); Bruce W. Chignola, Marlborough, MA (US)

(73) Assignee: The Raytheon Company, Lexington, MA (US)

( * ) Notice: Subject to any disclaimer, the term of this patent is extended or adjusted under 35 U.S.C. 154(b) by 0 days.

(21) Appl. No.: 09/974,023

(22) Filed: Oct. 10, 2001

(65) Prior Publication Data

US 2002/0048927 A1 Apr. 25, 2002

Related U.S. Application Data

(63) Continuation of application No. 09/410,328, filed on Oct. 1, 1999, now abandoned.
(60) Provisional application No. 60/102,871, filed on Oct. 2, 1998.

(51) Int. Cl.[7] ............................................... H01L 29/00
(52) U.S. Cl. ........................................ 257/532; 257/533
(58) Field of Search ............................... 257/532, 533, 257/535, 758, 773, 777

(56) References Cited

U.S. PATENT DOCUMENTS

| | | | | |
|---|---|---|---|---|
| 4,890,192 A | * | 12/1989 | Smith | 361/313 |
| 5,274,270 A | * | 12/1993 | Tuckerman | 257/758 |
| 5,841,193 A | * | 11/1998 | Eichelberger | 257/723 |
| 5,973,910 A | * | 10/1999 | Gardner | 361/313 |

FOREIGN PATENT DOCUMENTS

JP          406295981 A     *   10/1994

* cited by examiner

Primary Examiner—Hoai Pham
(74) Attorney, Agent, or Firm—Foley Hoag LLP

(57) ABSTRACT

The invention provides systems and methods for interconnecting circuit devices, wherein decoupling capacitors are disposed on a substrate and an interconnect layer having a pattern of circuit connections is formed by a deposition process over the capacitors thereby embedding the decoupling capacitors within the interconnect layer. Circuit devices can be mounted to the surface of the deposited interconnect layer at locations that minimize, or substantially minimize, the interconnect length between the chip device and the decoupling capacitors for that circuit device.

12 Claims, 4 Drawing Sheets

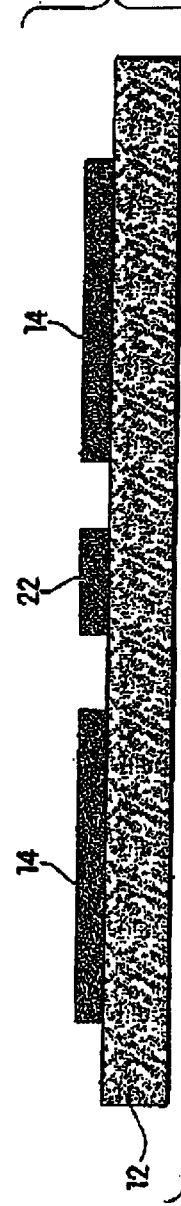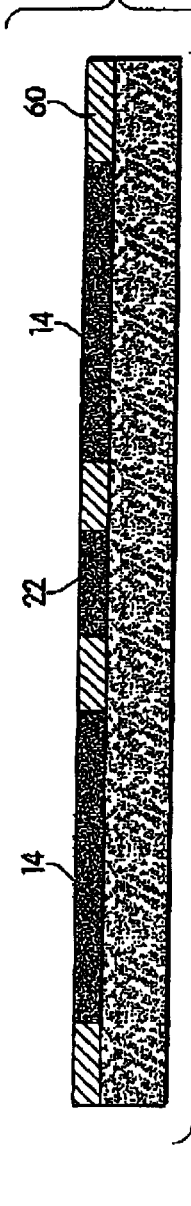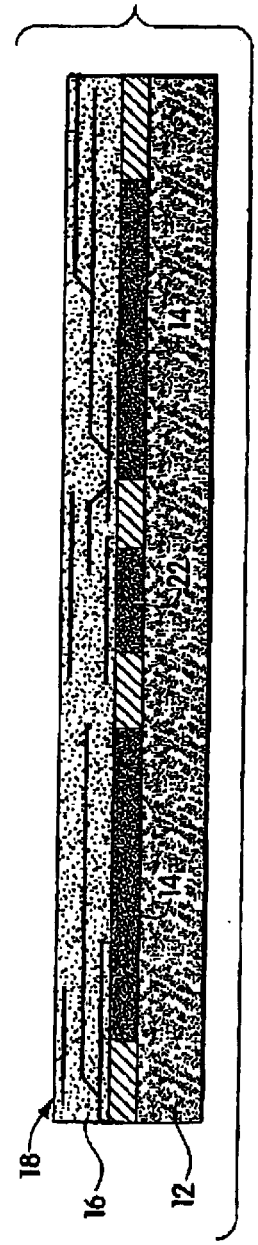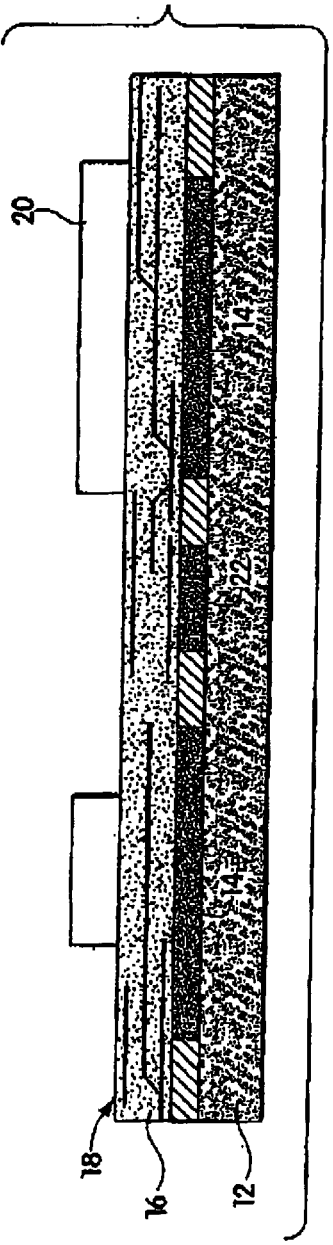

EMBEDDED CAPACITOR MULTI-CHIP MODULES

This application is a continuation of U.S. patent application Ser. No. 09/410,328 filed on Oct. 1, 1999 now abandoned, which claims the benefit of Provisional application Ser. No. 60/102,871, filed Oct. 2, 1998. The contents of the aforementioned application is hereby incorporated by reference.

FIELD OF THE INVENTION

The invention relates to systems and methods for interconnecting circuit devices, and more particularly, to systems and methods for providing multi-chip module (MCM) devices having reduced transmission noise on the power and ground planes.

BACKGROUND OF THE INVENTION

High performance mixed signal A/D circuits require improved power distribution and decoupling as compared with conventional circuit devices. In addition, the inductive and capacitive parasitic losses present in conventional single chip packaging and surface mount technology dictate that many new high performance circuit designs be implemented using multi-chip module (MCM) packaging technologies.

A multi-chip module (MCM) is a single electronic package containing more than one IC. An MCM combines high performance ICs with a custom-designed common substrate structure which provides mechanical support for the chips and multiple layers of conductors to interconnect them. This arrangement takes better advantage of the performance of the ICs than does interconnecting individually packaged ICs because the interconnect length is much shorter. The defining characteristic of MCMs is the complex substrate structure that contains the circuit pattern that interconnects the ICs and which is fabricated using multi-layer ceramics, polymers, silicon, metals, glass ceramics, laminates, or other suitable materials.

Multi-Chip Modules (MCMs) offer a way to pack more integrated circuits into a given module surface area. In addition to reducing size, this technology permits increased speed because it shrinks interconnect distances. A typical MCM has bare ICs mounted on a high-density interconnect (HDI) substrate encapsulated within an environmentally-protected package.

Types of MCMs include: MCM-L (laminated PC board), MCM-C (co-fired ceramic), MCM-D (deposited thin film), and MCM-Si (silicon substrate). MCM-C technology is based on ceramic dielectrics, noble metals and thick film processing. MCM-L technology is based on organic dielectrics, plated copper metallization and laminate preceding. MCM-D technology is based on deposited dielectrics, copper or aluminum metallization and thin film processing. More formal definitions for these primary types of MCMs have been established by the Institute for Interconnecting and Packaging Electronic Circuits (IPC). In particular, MCM-L are understood as modules which are constructed of plastic laminate-based dielectrics and copper conductors utilizing advanced forms of printed wiring board (PWB) technologies to form the interconnects and vias. They are commonly called "laminate MCMs". MCM-C modules are understood as modules which are constructed on confided ceramic or glass-ceramic substrates using thick film (screen printing) technologies to form the conductor patterns using fireable metals. The term "cofired" implies that the conductors and ceramic are heated at the same time. These are also called thick film MCMs. MCM-D modules are understood as modules which are formed by the deposition of thin film metals and dielectrics, which may be polymers or inorganic dielectrics. These are commonly called thin film MCMs.

From the above definitions, it can be understood that MCM-Cs are descended from classical hybrid technology, and MCM-Ls are essentially sophisticated printed circuit boards. On the other hand, MCM-Ds are the result of manufacturing technologies that draw heavily from the semiconductor industry.

The application of MCM technologies for developing high performance, mixed signal circuits aids in addressing the interconnection challenges that arise when developing these devices. The high switching speeds, high bandwidth, and high dynamic range of these circuits require that the power/ground distribution systems provide very low impedance decoupling with very low noise and ripple. The AC and DC loss characteristics of the substrate signal interconnect structure must be low and must provide sufficient signal, power, and ground layers to accommodate both analog and digital power and ground planes. In high speed circuits where substantial current switching is occurring, the decoupling performance is directly affected by the series inductance between the capacitor elements and the power and ground planes. Voltage spikes caused by $L*di/dt$ effects will result in voltage differences in the power and ground planes. Low inductance surface mounted capacitors have been developed, however, electrical simulation results of standard MCM structures with surface mounted low inductance chip capacitors indicate that these structures still behave as LC transmission lines allowing the propagation of waves across the ground plane. Voltage differences of greater than 30 mV were obtained in simulations.

Present commercially available MCM interconnect solutions are comprised of the three basic MCM technologies, MCM-C, MCM-L, and MCM-D. Generally, these technologies rely on surface mounted capacitor chip components to provide decoupling capacitance for the IC devices. Although, this technique can work well, the current switching demands of high speed circuits can still pull sufficient current through the power lines to cause voltage spiking and ground bounce.

A better solution is to distribute the decoupling capacitance by placing the power and ground layers next to each other separated by a thin dielectric layer. This makes the decoupling capacitance integral to the substrate structure and provides the lowest series inductance.

However, in most cases this integral distributed decoupling capacitance is too small to be sufficiently effective due to the relatively low dielectric constants of the dielectric materials being used and the relatively large spacing between the power and ground layers. One specific MCM-D technology, manufactured by nChip Inc. utilizes multi-layer thin film processing with aluminum metallization and $SiO_2$ dielectric fabricated on a silicon substrate. This technology is described in U.S. Pat. No. 5,134,539. However, this MCM-D technology is typically limited to 4 metal layers consisting of 1 power plane, 1 ground plane, and 2 signal layers, and therefore, fails to provide a sufficient number of layers to create an interconnect layer that allows separation of the analog and digital sections for mixed signal application. Additionally, the aluminum metallization applied by this process is more resistive than equivalent copper metallization, and therefore results in RC losses in the signal traces.

Therefore, a need remains in the art as none of the existing interconnect structures provide the features required or desired for high performance mixed signal A/D circuits.

SUMMARY OF THE INVENTION

It is an object of the invention to provide improved interconnect systems for high performance circuit devices, including high performance mixed signal A/D circuit devices.

To this end, the invention provides systems and methods for interconnecting circuit devices, wherein decoupling capacitors are disposed on a substrate and an interconnect layer having a pattern of circuit connections is formed by a deposition process over the capacitors, thereby embedding the decoupling capacitors within the interconnect layer. Circuit devices can be mounted to the surface of the deposited interconnect layer at locations that minimize, or substantially minimize, the interconnect length between the chip device and the decoupling capacitors for that circuit device.

More particularly, the systems and methods described herein, in one aspect, include methods for forming an interconnecting substrate comprising providing a support base, disposing on the support base a decoupling capacitor and employing a deposition process to form an interconnect layer over the decoupling capacitor, whereby an interconnecting substrate is formed having an embedded decoupling capacitor. In certain practices, the methods can include the step of forming electrical connections on a surface of the interconnect layer and extending into the interconnect layer, thereby allowing devices to be mounted on the surface of the interconnect layer. The devices can be mounted to the surface of the interconnect layer by wire bond mounting, flip chip mounting or any other suitable technique.

In a particular practice, the act of employing a deposition process to form an interconnect layer can include an act of forming an interconnect layer having a plurality of power and ground planes as well as forming an interconnect layer having a plurality of signal planes. The deposition process can optionally include a process that provides a low loss copper metallization structure having a plurality of metal layers, and separate layers can be provided for analog circuits and digital circuits.

In a further practice, the interconnect layer can be formed over a support base that carries a plurality of decoupling capacitors, wherein the decoupling capacitors are distributed across the support base at locations that are selected to align with circuit devices that are to be disposed on the surface of the interconnect layer. The decoupling capacitors can have a common ground plane and, optionally, can act to provide decoupling capacitance for a plurality of different power planes, at least some of which can be at different voltage levels. In a further practice, resistors, such as terminating resistors, as well as other devices can be disposed on the support base and embedded along with the decoupling capacitors in the interconnect layer that can be deposited over these elements.

In a further aspect, the invention can be understood as multi-chip module devices that comprise a support base, having disposed thereon a decoupling capacitor and an interconnect layer having a pattern of circuit connections contained therein and having the decoupling capacitors embedded within the interconnect layer. A plurality of circuit devices can be mounted to a surface of the interconnect layer and connected electrically with the pattern of circuit connections formed within the interconnect layer. Optionally, resistor elements, such as terminating resistors, can be carried on the surface of the support base and embedded, along with the decoupling capacitors, into the interconnect layer. Other elements and devices can also be embedded within the interconnect layer.

In one particular embodiment, the MCM device can include an interconnect layer that includes a plurality of metal layers which can form the circuit pattern for interconnecting the devices, or at least a portion of the circuit pattern that interconnects the devices. The substrate base can be formed of silicon, polycrystalline silicon, or any other suitable material. The decoupling capacitors can comprise a silicon oxide dielectric, a polyimide dielectric, aluminum oxide, organic material dielectrics, or any other suitable dielectric materials. The dielectric material is disposed between conductive plates, that can be made of aluminum, copper, tungsten, or any other suitable plating. The decoupling capacitors can provide a distributed decoupling capacitance for decoupling power lines carrying power to the circuit devices. The circuit devices can be wire bonded, flip chip mounted, or mounted using any suitable technique onto the surface of the interconnect layer.

Other practices and embodiments of the systems and methods described herein can be modified from the following descriptions.

BRIEF DESCRIPTION OF THE DRAWINGS

The foregoing and other objects and advantages of the invention will be appreciated more fully from the following further description thereof, with reference to the accompanying drawings wherein;

FIGS. 4–7 depict a process for forming a multi-chip module, of the type depicted in FIG. 1 of decoupling capacitors disposed on a support base and embedded within an interconnect layer.

DETAILED DESCRIPTION OF THE ILLUSTRATED EMBODIMENTS

To provide an overall understanding of the invention, certain illustrative embodiments will now be described. However, it will be understood by one of ordinary skill in the art that the systems described herein can be adapted and modified to provide interconnecting structures and processes for other applications and that other additions and modifications can be made to the invention without departing from the scope hereof.

Figure 1:
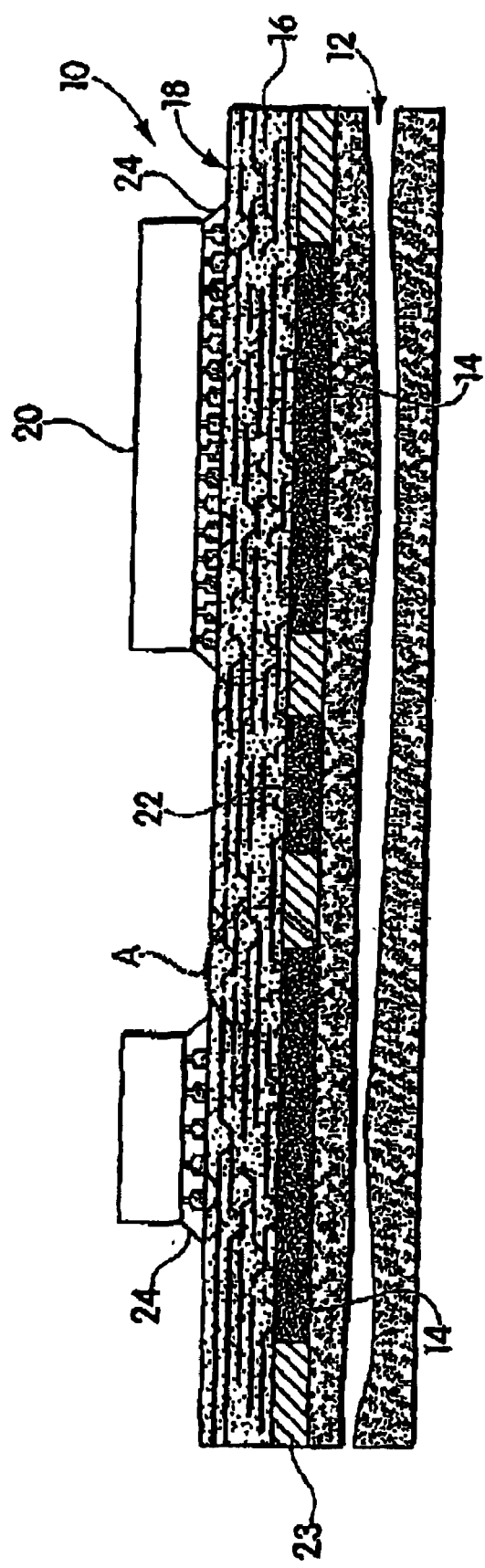
FIG. 1 depicts a multi-chip module having decoupling capacitors embedded within an interconnect layer.

The systems and methods described herein provide, inter alia, interconnecting devices that can support high performance mixed signal A/D circuits, and in particular can provide the power distribution and decoupling required for the proper operation of such high performance mixed signal A/D circuit devices. FIG. 1 depicts one embodiment of a multi-chip module (MCM) device 10 that can comprise mixed signal A/D circuits carried on an interconnect layer that includes embedded decoupling capacitors disposed within the interconnect layer and located for reducing the interconnect length between the circuit devices and the decoupling capacitors.

More particularly, FIG. 1 depicts an MCM device 10 that comprises a substrate 12, decoupling capacitors 14, and interconnect layer 16, and a plurality of circuit devices 20.

As shown in FIG. 1, the substrate 12 can support the decoupling capacitors 14, as well for this embodiment a resistor device 22. A filler material is provided within the interstices that occur between the decoupling capacitors 14 and the resistor device 22. As further shown by FIG. 1, an interconnecting layer 16 is formed over the decoupling layer that is defined by the decoupling capacitors 14, the resistive device 22 and the filler material. The interconnecting layer 16 can comprise a plurality of signal, power and ground planes that provide a pattern of circuit connections for interconnecting the circuit devices 20. The circuit devices 20 can be mounted onto the surface 18 of the interconnecting layer 16, and electrically connected to the interconnecting layer 16. In the embodiment depicted in FIG. 1, the circuit devices 20 are flip chip mounted by applying an under fill 24 to one side of the circuit device 20 to thereby mount the circuit device 20 to the surface 18 of the interconnect layer 16.

The support base 12 depicted in FIG. 1 can be formed of ceramic, silicon, polycrystalline silicon or other suitable material. The support base 12 can be any shape or any size, and the actual configuration of the support base 12 will depend upon the application.

The decoupling capacitors 14 depicted in FIG. 1 can be integral decoupling capacitors suitable for use with a multi-chip module such as the MCM 10. In one embodiment, the capacitors 14 are chip level devices that can be disposed on, or mounted to the support base 12, as a component. Optionally the decoupling capacitors 14 can be formed on the support base 12 by depositing an anodizable metal to form a first plate of the capacitive element. The metal can then be anodized to form a dielectric layer. A second layer of metal can then be formed over the dielectric layer to thereby form the capacitor 14. Techniques for forming such capacitors are known in the art, including, from the description in U.S. Pat. No. 5,134,539, and will be described in more detail hereinafter.

Figure 2:
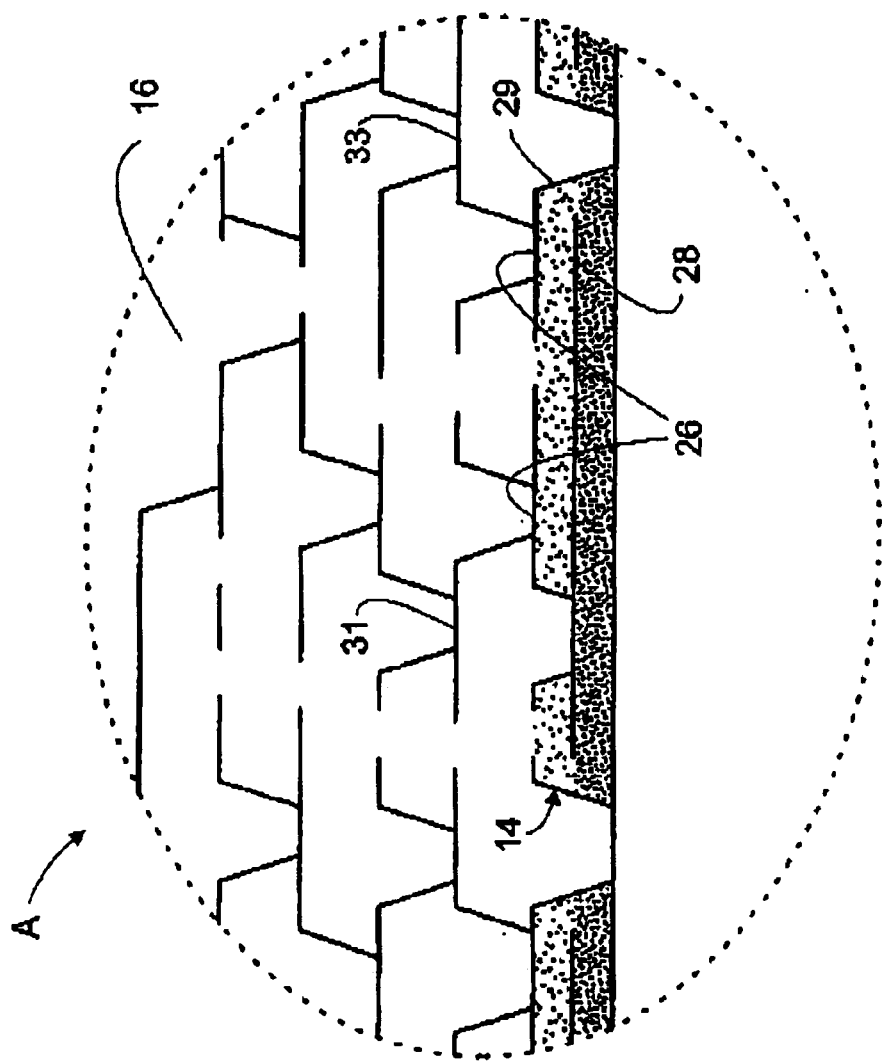
FIG. 2 depicts in greater detail one portion of a substrate base having decoupling capacitors embedded within an interconnect layer disposed thereon

Turning to FIG. 2, one portion, section A, of the MCM module 10 depicted in FIG. 1 is shown in greater detail. Specifically, FIG. 2 presents an enlarged view of section A of the MCM module 10, and more specifically depicts the decoupling capacitor 14 which is embedded within the interconnect layer 16. FIG. 2 presents a cross-sectional view of this portion of the MCM device 10 which cross-sectional view illustrates that the MCM device 10 is a multilayer device. FIG. 2 further shows that the decoupling capacitors 14 can be electrically coupled to the ground plane 33 and power plane 31 of the MCM module 10. FIG. 2 further depicts that the interconnect layer 16 can include a plurality of layers that can be organized into a pattern of circuit connections that can be employed for interconnecting the circuit devices 20 mounted to the surface 18 of the interconnect layer 16. FIG. 2 further shows that the interconnect layer 16 can include power and ground connections, 31 and 33, that can provide power to the circuit devices 20 and which are decoupled by the decoupling capacitors 14. In certain exemplary embodiments, the decoupling capacitor 14 may be connected in parallel with the power plane 31 and the ground plane 33.

Specifically, FIG. 2 illustrates that the capacitors 14 can have pads 26 located on an upper surface of the capacitors 14. The pads 26 can provide contact points that are electrically connected to the power plane 28 and ground plane 29 that form capacitor 14. The interconnect layer 16 includes metal layers, such as the ground layer 33 and the power layer 31, that connect to these contact points and therefore extend the ground plane 29 and power plane 28 of the capacitor 14. The metal layers can connect, optionally in almost a direct line, through the interconnect layer 16 and to the power and ground connections of the circuit devices 20. In this way, the MCM 10 can provide a reduced interconnect lead and a low inductance chip to decoupling capacitor connection.

The depicted interconnect layer 16 can be formed over the decoupling capacitors 14 by a deposition process that forms the power planes, ground planes and interconnect layers on top of circuit components being connected together. One such deposition process is the type provided by EPIC Technologies, Inc. and which is capable of providing a low loss MCM copper metallization structure having six metal layers therein. The process for forming such an interconnect layer 16 follows from principles known in the art of circuit fabrication, including those set forth in U.S. Pat. No. 5,841,193, assigned to EPIC Technologies of Woburn, Mass. However, it will be understood by those of ordinary skill in the art that any other technique suitable for providing an interconnect layer on top of the decoupling capacitors 14 can be practiced. Moreover, it will be understood that the type of process employed for forming the interconnect layer can vary depending on the application, such as the number of layers needed, whether multiple separate power planes are required, and other such criteria.

Figure 3A:
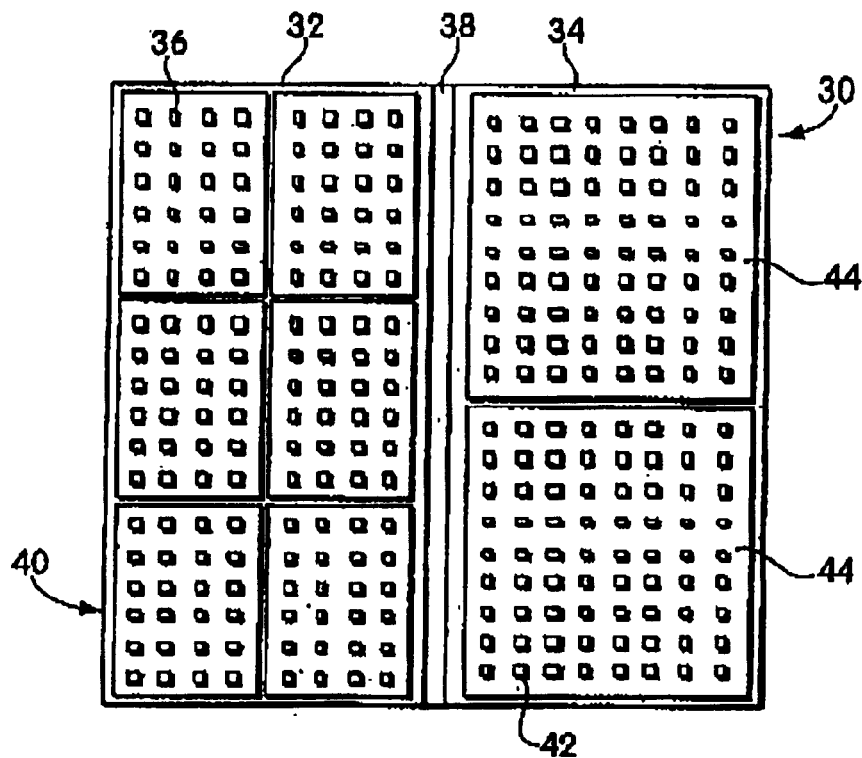
FIGS. 3A and 3B depict one embodiment of a decoupling capacitor suitable for use with the multi-chip module of FIG. 1.
Figure 3B:
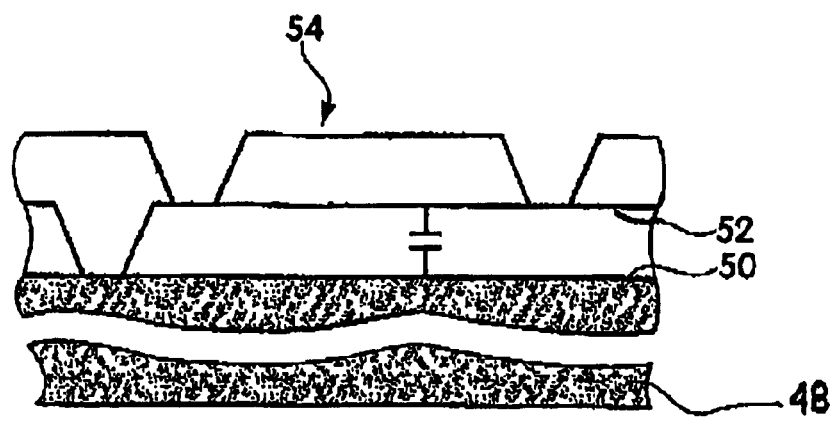

FIGS. 3A–3B depict one particular embodiment of a decoupling capacitor 30 that can be employed with the MCM 10 depicted in FIG. 1. The depicted decoupling capacitor 30 is a component that is mounted to the support base 12 before the interconnect layer 16 is formed. The decoupling capacitor 30 can comprise a thin film MCM-D technology fabricated device, and in particular can be formed by multi-layer thin film processing with copper or aluminum metallization and $SiO_2$ dielectric material fabricated on a silicon base as shown in FIG. 2. One such capacitor and techniques for forming such a capacitor is generally described in the above referenced U.S. Pat. No. 5,134,539.

FIG. 3A provides a overhead view of the decoupling capacitor device 30 that is formed as a component level device and which is capable of decoupling a power plane and a ground plane for an MCM device. The decoupling capacitor 30 is a silicon base die decoupling capacitor with an embedded ground and power plane and a $SiO_2$ dielectric material disposed therebetween. The decoupling capacitor 30 can be sized and shaped for the application at hand, and the depicted decoupling capacitor 30 is not to be understood as an exhaustive representation of the structure of the decoupling capacitors suitable for use with the present invention. Moreover, other dielectric materials can be employed, and the type of dielectric will depend upon the application. It is understood however that the silicon material dielectric should provide good thermal expansion properties. As shown in FIG. 3A the depicted decoupling capacitor 30 includes a first section 32 and a second section 34. Thus a given die can support more than one capacitor. The first section 32 of the depicted decoupling capacitor 30 comprises six individual capacitors each of which share a common ground plane. In this depicted embodiment, each of the six individual capacitors 36 are substantially the same size, thereby providing substantially the same capacitance. The second portion 34 of the depicted capacitor 30 comprises two capacitors 44 each of approximately the same size, and each larger than the individual capacitors 36 of the first portion 32. Accordingly, it will be understood that the individual capacitors 44 provide greater capacitance than the individual capacitors 36 of the first portion 32. The size and the shape of the capacitors can vary depending upon the application, and those of ordinary skill in the art will be able to select the proper capacitance for decoupling the circuit Further, the distribution, arrangement of the capacitors can vary depending upon the application, and for example, separate capacitors, with separate ground planes can be employed for decoupling different circuit devices to for example allow separate decoupling of analog and digital circuit devices. These arrangements can vary depending upon the application.

For both capacitors 36 and 44, the top surface comprises a plurality of pads each of which can be employed for forming an electrical connection with the interconnect layer 16 that can be formed over these decoupling capacitors. Turning to FIG. 3B a cross-sectional view is presented of these decoupling capacitors 36 and 44. Specifically, FIG. 3B shows a silicon base 48 upon which a ground plane 50 is disposed. Above the ground plane is a power plane 52. Disposed between the power plane 52 and the ground plane 50 is a dielectric material which can be any suitable dielectric material such as $SiO_2$, polyimide or any other suitable material. The ground planes 50 and power planes 52 can be formed of aluminum, copper, aluminum oxide or other conductive material. The power planes, ground planes and dielectric material can be stacked in layers to provide a selected capacitance appropriate for the application. As further shown by FIG. 3B, gaps 54 can be disposed at locations within the power or ground planes that allow for separating the power and ground planes from each other thereby preventing a short circuit. The metal layers within the interconnect layer 16 can electrically couple to these pads, thereby connecting the circuit pattern to the power and ground planes at a location that is proximate to, or at, the location of the decoupling capacitors. This allows for minimizing the interconnect distance.

By way of example, the decoupling capacitor 30 can provide a relatively high capacitance decoupling structure, in the range of 1 to 1000 $nf/cm^2$, and more particularly, in the range of about 50 $nF/cm^2$, formed between the power and ground layers. Thus the circuit devices 20 can be connected over the short interconnect paths to a decoupling capacitance capable of reducing voltage spikes, cross-talk and signal noise.

FIGS. 4–7 depict certain stages of one process for forming an interconnecting substrate having embedded decoupling capacitors. For purposes of clarity, the process of FIGS. 4–7 depict one MCM process for forming an interconnect layer. However, it will be understood by those of skill in the art that any MCM fabrication techniques, such as MCM-L techniques for forming laminated PC board type interconnects, MCM-C techniques for forming co-fired ceramic interconnect layers, MCM-D techniques for forming deposited thin film interconnect layers, and MCM-Si for providing silicon substrate based interconnect layers, as well as various combinations of these techniques, can be employed with the systems and methods described herein without departing from the scope of the invention.

Turning back to FIG. 4, it can be seen that FIG. 4 specifically depicts a step of the process wherein the support base 12 has disposed and arranged on its upper surface a plurality of components that are to be embedded into the interconnecting layer that will have a circuit pattern, or a portion of a circuit pattern, contained therein. In FIG. 4, two decoupling capacitors 14 terminating resistor 22 are positioned in the service of the supporting base 12. In one practice, the decoupling capacitors 14 in the resistive element 22 are adhesiveably bonded to the upper surface of the supporting base 12.

FIG. 5 depicts that in a subsequent step a structural material, such as a polymer filler, can be deposited onto the surface of the supporting base 12 and built up to be co-planar with the pads of the decoupling capacitors 14 and the resistive element 22. The structural material can be cured to provide mechanical support within the interstices that occur between the different elements mounted to the support base 12. In optional alternative practices, the structural material 60 can be lapped, or otherwise shaped for receiving additional circuit devices or component, as well as for creating spaces for receiving interconnect layers. The actual shape of the component layer that includes the components and the filler material 60 can vary depending upon the application and those of skill in the art will recognize that such modifications can be made without departing from the scope of the invention.

FIG. 6 depicts that an interconnect layer 16 can be formed on top of the component layer. In one practice, an in situ process can be performed wherein a dielectric layer is directly deposited on the upper surface of the plurality of components, in this case the decoupling capacitors 14 and the resistive element 22. Further processing can include patterning and forming vias in the in situ formed dielectric layer. The vias can be disposed within this layer to expose at least some of the contact pads at the upper surface of the decoupling capacitors 14 and the resistive element 12. Such exposed contacts facilitate electrical connections to the connecting layers that can be later deposited. To this end, the forming of a metalization structure above the in situ processed dielectric can occur in a manner that allows metalization within the vias. Metal formed within the vias can create electrical connections to at least some of the contact pads exposed by the vias and carried on the surface of the components. For the interconnect layer 16 depicted in FIG. 6, a plurality of layers have been deposited in sequence to form the circuit pattern. Accordingly, in subsequent steps further chip interconnect layers can be added by alternatively applying dielectric and metalization layers. Although photo patterning of the deposited dielectric layers provides one process for forming the interconnect layer 16, it will be understood by those of ordinary skill in the art that other techniques can be employed for depositing the interconnect layer and thereby forming the circuit pattern for the MCM device. Moreover, it will be understood by those with ordinary skill in the art that although the interconnect layer 16 depicted in FIG. 6 is shown as having a plurality of metalized layers, that such a module can be formed with a single layer, or two layers, and that no specific number of layers is necessary for the practice of the invention. Additionally, it will be understood that in optional embodiments and practices, decoupling capacitors and other components, can be disposed between metallic layers, by placing these devices on the interconnect layer partially through the deposition process.

In FIG. 7, it is shown that the circuit devices 20 can be mounted to the surface 18 of the interconnect layer 16. The devices 20 can be mounted and bonded to the interconnect layer 16 by any suitable technique such as wire bonding, soldering, epoxingd, flip chip mounting, or any combination of these techniques. To this end, the surface 18 of the interconnecting layer 16 can carry contact or bonding pads that provide the circuit devices 20 with electrical connections to the circuit pattern within the interconnecting layer 16. The circuit devices 20 can be analog devices, digital devices, mixed A/D devices, or any other type of devices. The circuit devices can employ any type of semiconductor technology, including CMOS, nMOS, gaAs and bipolar technologies. Additionally, discrete components, such as inductors, antennas, connectors, resistors, additional capacitors, or any other such devices can be mounted or connected to the MCM 10, such as by being bonded to contact pads on the surface 18.

The above described embodiments have been described as having MCM modules. However, it will be understood that the systems and methods described herein are not to be limited to systems and methods that include MCM packaging technologies, and that many IC packaging technologies can be practiced with the systems and methods described herein. For example, the systems and methods described herein can be practiced with any packaging technology that supports packaging efficiency, chip population, and I/O density can be employed herewith, and in particular, any packaging technology that provides a dense conductor matrix for the interconnection of bare IC chips, can be employed, including packaging technologies that support High Density Interconnect (HDI) modules.

Those skilled in the art will know or be able to ascertain using no more than routine experimentation, many equivalents to the embodiments and practices described herein. Accordingly, it will be understood that the invention is not to be limited to the embodiments disclosed herein, but is to be understood from the following claims, which are to be interpreted as broadly as allowed under the law.

We claim:

1. A device for interconnecting a plurality of circuit devices, comprising:
   a decoupling capacitor mounted on a first surface and having a grounding pad and a power pad formed on a top surface of said decoupling capacitor; and
   an interconnect layer having a pattern of circuit connections and being formed over said top surface of said decoupling capacitor, whereby electrical connections to said decoupling capacitor are embedded within said interconnect layer and said interconnect layer is disposed between said decoupling capacitor and said plurality of circuit devices,
   and whereby said pattern of circuit connections of said interconnect layer is coupled to said decoupling capacitor and said plurality of circuit devices, said pattern of circuit connections coupling to said grounding pad and said power pad of said decoupling capacitor.

2. The device according to claim 1, wherein said pattern of circuit connections includes at least one of the following to interconnect said plurality of circuit devices: a signal plane, a power plane and a ground plane.

3. The device according to claim 1, wherein said interconnect layer includes a power plane and a ground plane, and wherein said decoupling capacitor connects in parallel between said power and ground planes.

4. The device according to claim 1, wherein said decoupling capacitor comprises a silicon containing dielectric material.

5. The device according to claim 1, wherein said interconnecting layer comprises a plurality of aluminum containing conductive paths.

6. The device according to claim 1, wherein said interconnecting layer comprises a plurality of copper containing conductive paths.

7. The device according to claim 1, wherein said decoupling capacitor comprises a silicon base die decoupling capacitor.

8. The device according to claim 1, said decoupling capacitor having a capacitance in the range of 1 to 1000 $nf/cm^2$.

9. The device according to claim 8, said decoupling capacitor having a capacitance of approximately 50 $nf/cm^2$.

10. The device according to claim 1, further comprising a plurality of decoupling capacitors mounted on said first surface.

11. The device according to claim 10, wherein each of said plurality of circuit devices is in electrical communication with at least one of said decoupling capacitors.

12. The device according to claim 1, further comprises at least one resistor mounted on said first surface.

* * * * *